(12) United States Patent
Sinha et al.

(10) Patent No.: US 7,244,678 B2
(45) Date of Patent: Jul. 17, 2007

(54) METHODS FOR PLANARIZATION OF GROUP VIII METAL-CONTAINING SURFACES USING COMPLEXING AGENTS

(75) Inventors: Nishant Sinha, Boise, ID (US); Rita J. Klein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/081,413

(22) Filed: Mar. 16, 2005

(65) Prior Publication Data

US 2005/0159086 A1    Jul. 21, 2005

Related U.S. Application Data

(63) Continuation of application No. 10/028,040, filed on Dec. 21, 2001, now Pat. No. 6,884,723.

(51) Int. Cl.
*H01L 21/302* (2006.01)
*H01L 21/461* (2006.01)

(52) U.S. Cl. .................. 438/691; 438/692; 438/693

(58) Field of Classification Search .................. None
See application file for complete search history.

(56) References Cited

U.S. PATENT DOCUMENTS

| | | | |
|---|---|---|---|
| 4,035,500 A | 7/1977 | Drafter, Jr. | |
| 4,297,436 A | 10/1981 | Kubortera et al. | |
| 4,670,306 A | 6/1987 | Salem | |
| 4,747,907 A | 5/1988 | Acocella et al. | |
| 4,992,137 A | 2/1991 | Cathey, Jr. et al. | |
| 5,254,217 A | 10/1993 | Maniar et al. | |
| 5,318,927 A | 6/1994 | Sandhu et al. | |
| 5,378,492 A | 1/1995 | Mashiko | |
| 5,380,401 A | 1/1995 | Jones et al. | |
| 5,392,189 A | 2/1995 | Fazan et al. | |
| 5,480,854 A | 1/1996 | Rajaram et al. | |
| 5,527,423 A | 6/1996 | Neville et al. | |
| 5,575,885 A | 11/1996 | Hirabayashi et al. | |
| 5,692,950 A | 12/1997 | Rutherford et al. | |
| 5,695,384 A | 12/1997 | Beratan | |
| 5,700,383 A | 12/1997 | Feller et al. | |
| 5,711,851 A | 1/1998 | Blalock et al. | |
| 5,786,259 A | 7/1998 | Kang | |
| 5,888,906 A | 3/1999 | Sandhu et al. | |

(Continued)

FOREIGN PATENT DOCUMENTS

EP    1 111 083    6/2001

(Continued)

OTHER PUBLICATIONS

U.S. Appl. No. 11/058,140, filed Feb. 15, 2005, Vaartstra.

(Continued)

*Primary Examiner*—Duy-Vu N. Deo
(74) *Attorney, Agent, or Firm*—Mueting, Raasch & Gebhardt, P.A.

(57) ABSTRACT

A planarization method includes providing a second and/or third row Group VIII metal-containing surface (preferably, a platinum-containing surface) and positioning it for contact with a polishing surface in the presence of a planarization composition that includes a complexing agent.

18 Claims, 2 Drawing Sheets

U.S. PATENT DOCUMENTS

| | | |
|---|---|---|
| 5,916,855 A | 6/1999 | Avanzino et al. |
| 5,935,871 A | 8/1999 | Farkas et al. |
| 5,954,997 A | 9/1999 | Kaufman et al. |
| 5,958,794 A | 9/1999 | Bruxvoort et al. |
| 5,976,928 A | 11/1999 | Kirlin et al. |
| 5,981,454 A | 11/1999 | Small |
| 5,989,988 A | 11/1999 | Iinuma et al. |
| 6,015,506 A | 1/2000 | Streinz et al. |
| 6,039,633 A | 3/2000 | Chopra |
| 6,045,716 A | 4/2000 | Walsh et al. |
| 6,069,080 A | 5/2000 | James et al. |
| 6,071,816 A | 6/2000 | Watts et al. |
| 6,110,830 A | 8/2000 | Skrovan et al. |
| 6,143,191 A | 11/2000 | Baum et al. |
| 6,143,192 A | 11/2000 | Westmoreland |
| 6,149,828 A | 11/2000 | Vaartstra |
| 6,211,034 B1 | 4/2001 | Visokay et al. |
| 6,261,157 B1 | 7/2001 | Bajaj et al. |
| 6,278,153 B1 | 8/2001 | Kikuchi et al. |
| 6,290,736 B1 | 9/2001 | Evans |
| 6,306,012 B1 | 10/2001 | Sabde |
| 6,346,741 B1 | 2/2002 | Van Buskirk et al. |
| 6,368,518 B1 | 4/2002 | Vaartstra |
| 6,379,406 B1 | 4/2002 | Thomas et al. |
| 6,395,194 B1 * | 5/2002 | Russell et al. ............. 252/79.1 |
| 6,436,723 B1 | 8/2002 | Tomita et al. |
| 6,451,214 B1 | 9/2002 | Westmoreland |
| 6,454,957 B1 | 9/2002 | Westmoreland |
| 6,476,491 B2 | 11/2002 | Harada et al. |
| 6,527,622 B1 | 3/2003 | Brusic et al. |
| 6,527,818 B2 | 3/2003 | Hattori et al. |
| 6,537,462 B1 | 3/2003 | Westmoreland |
| 6,589,100 B2 | 7/2003 | Moeggenborg et al. |
| 6,641,631 B2 | 11/2003 | Thomas et al. |
| 6,730,592 B2 | 5/2004 | Vaartstra |
| 6,756,308 B2 | 6/2004 | Small et al. |
| 6,840,971 B2 | 1/2005 | Wang et al. |
| 6,841,479 B2 | 1/2005 | Cherian et al. |
| 6,861,353 B2 | 3/2005 | Vaartstra |
| 6,884,723 B2 | 4/2005 | Sinha et al. |
| 7,049,237 B2 | 5/2006 | Uhlenbrock et al. |
| 2001/0006031 A1 | 7/2001 | Tsuchiya et al. |
| 2001/0023701 A1 | 9/2001 | Aoki et al. |
| 2002/0008265 A1 | 1/2002 | Beitel et al. |
| 2002/0017063 A1 | 2/2002 | Beitel et al. |
| 2002/0019088 A1 | 2/2002 | Basceri et al. |
| 2002/0039839 A1 | 4/2002 | Thomas et al. |
| 2002/0042208 A1 | 4/2002 | Beitel et al. |
| 2002/0050322 A1 | 5/2002 | Kunisawa et al. |
| 2002/0081853 A1 | 6/2002 | Beitel et al. |
| 2002/0111027 A1 | 8/2002 | Sachan et al. |
| 2003/0119316 A1 | 6/2003 | Klein et al. |
| 2003/0119321 A1 | 6/2003 | Unhlenbrock et al. |
| 2003/0119426 A1 | 6/2003 | Sabde et al. |
| 2003/0121891 A1 | 7/2003 | Westmoreland |
| 2003/0138561 A1 | 7/2003 | Westmoreland |
| 2005/0148182 A1 | 7/2005 | Vaartstra |

FOREIGN PATENT DOCUMENTS

| | | |
|---|---|---|
| EP | 1 123 956 | 8/2001 |
| EP | 1 156 091 | 11/2001 |
| JP | 11-512874 | 11/1999 |
| JP | 2000 200782 | 7/2000 |
| WO | WO 98/06541 | 2/1998 |
| WO | WO 98/36045 | 8/1998 |
| WO | WO 99/27581 | 6/1999 |
| WO | WO 99/53532 | 10/1999 |
| WO | WO 00/31794 | 6/2000 |
| WO | WO 01/44396 | 6/2000 |
| WO | WO 00/77107 | 12/2000 |
| WO | WO 02/084718 | 10/2002 |
| WO | WO 03/056620 | 7/2003 |
| WO | WO 03/059571 | 7/2003 |
| WO | WO 03/060028 | 7/2003 |
| WO | WO 03/060980 | 7/2003 |

OTHER PUBLICATIONS

Canterford et al., "Chapter 9: Rhodium and Iridium," *Halides of the Transition Elements, Halides of the Second and Third Row Transition Metals*, John Wiley & Sons, New York, NY, 1968; pp. 346-357, publication page, title page (14 pages total).

DeOrnellas et al., "Challenges for Plasma Etch Integration of Ferroelectric Capacitors in FeRAM's and DRAM's," *Integrated Ferroelectrics*, 1997;17:395-402.

DeOrnellas et al., "Plasma Etch of Ferroelectric Capacitors in FeRAMs and DRAMs," *Semiconductor International*, Sep. 1997; pp. 103-104, 106 and 108.

Ginzburg et al., *Analytical Chemisty of Platinum Metals*, John Wiley & Sons, New York, cover pg., and 14-15.

Kim et al., "Chemical Dry Etching of Platinum Using $Cl_2$/CO Gas Mixture," *Chem. Mater.*, 1998;10:3576-3582.

Kwon et al., "Etching properties of Pt thin films by inductively coupled plasma," *J. Vac. Sci. Technol.*, 1998;A 16(5):2772-6.

Nakao, "Dissolution of Noble Metals in Halogen-Halide-Polar Organic Solvent Systems," *J. Chem. Soc., Chem. Commun.*, Mar. 1, 1992; 5:426-7.

Weast et al., "CRC Handbook of Chemistry and Physics," Chemical Rubber Publishing Company, 1989: D151-154.

Wilberg, *Lehrbuch der Anorganischen Chemie*, Walter de Gruyter, Berlin, 1985, p. 1118 (Translation of First Paragraph Only).

Xu et al., "Chemical Vapor Deposition (CVD) of Iridium and Platinum Films and Gas-Phase Chemical Etching of Iridium Thin Films," *Mat. Res. Soc. Symp. Proc.*, 1999;541:129-139.

Webster's II, New Riverside University Dictionary, 1984: pp. 258,842.

U.S. Appl. No. 11/398,903, filed Apr. 6, 2006, Sabde et al.
U.S. Appl. No. 11/398,950, filed Apr. 6, 2006, Uhlenbrock et al.
U.S. Appl. No. 10/314,887, filed Dec. 9, 2002, Westmoreland.
U.S. Appl. No. 09/625,568, filed Jul. 26, 2000, Wang et al.
U.S. Appl. No. 60/148,878, filed Aug. 13, 1999, Wang et al.
U.S. Appl. No. 60/170,612, filed Dec. 14, 1999, Thomas et al.
U.S. Appl. No. 60/171,553, filed Dec. 22, 1999, Reinhardt.

* cited by examiner

METHODS FOR PLANARIZATION OF GROUP VIII METAL-CONTAINING SURFACES USING COMPLEXING AGENTS

This is a continuation of application Ser. No. 10/028,040, filed Dec. 21, 2001 now U.S. Pat. No. 6,884,723, which is incorporated herein by reference.

FIELD OF THE INVENTION

The present invention relates to methods for planarization of Group VIII metal-containing (preferably, platinum-containing) surfaces, particularly in the fabrication of semiconductor devices.

BACKGROUND OF THE INVENTION

Films of metals and metal oxides, particularly the heavier elements of Group VIII, are becoming important for a variety of electronic and electrochemical applications. This is at least because many of the Group VIII metal films are generally unreactive, resistant to oxidation or retard the diffusion of oxygen, and are good conductors. Oxides of certain of these metals also possess these properties, although perhaps to a different extent.

Thus, films of Group VIII metals, their alloys, and metal oxides, particularly the second and third row metals (e.g., Ru, Os, Rh, Ir, Pd, and Pt) have suitable properties for a variety of uses in integrated circuits. For example, they can be used in integrated circuits for barrier materials, for example. They are particularly suitable for use as barrier layers between the dielectric material and the silicon substrate in memory devices. Furthermore, they are suitable as the plate (i.e., electrode) itself in capacitors.

Platinum is one of the candidates for use as an electrode for high dielectric capacitors. Capacitors are the basic charge storage devices in random access memory devices, such as dynamic random access memory (DRAM) devices, static random access memory (SRAM) devices, and now ferroelectric memory (FE RAM) devices. They consist of two conductors, such as parallel metal or polysilicon plates, which act as the electrodes (i.e., the storage node electrode and the cell plate capacitor electrode), insulated from each other by a dielectric material (a ferroelectric dielectric material for FE RAMs). Thus, there is a continuing need for methods and materials for the processing of Group VIII metal-containing films, preferably, platinum-containing films.

Many surfaces that result during the formation of Group VIII metal-containing films, particularly in the wafer fabrication of semiconductor devices, do not have uniform height, and therefore, the wafer thickness is also non-uniform. Further, surfaces may have defects such as crystal lattice damage, scratches, roughness, or embedded particles of dirt or dust. For various fabrication processes to be performed, such as lithography and etching, height non-uniformities and defects at the surface of the wafer must be reduced or eliminated. Also, excess material may need to be removed to form a structure with selectivity relative to the underlying substrate. Various planarization techniques are available to provide such reduction and/or elimination. One such planarization technique includes mechanical and/or chemical-mechanical polishing (abbreviated herein as "CMP").

The process of planarization is used to remove material, and preferably achieve a planar surface, over the entire chip and wafer, sometimes referred to as "global planarity."

Conventionally, the process of planarization, and particularly CMP, involves the use of a wafer holder that holds a wafer, a polishing pad, and an abrasive slurry that includes a dispersion of a plurality of abrasive particles in a liquid. The abrasive slurry is applied so that it contacts the interface of the wafer and the polishing pad. A table or platen has a polishing pad thereon. The polishing pad is applied to the wafer at a certain pressure to perform the planarization. At least one of the wafer and a polishing pad are set in motion relative to the other. In some planarization processes, the wafer holder may or may not rotate, the table or platen may or may not rotate and/or the platen may be moved in a linear motion as opposed to rotating. There are numerous types of planarization units available which perform the process in different manners. Alternatively, the polishing pad and abrasive slurry may be replaced by a fixed abrasive article that includes a plurality of abrasive particles dispersed within a binder adhered to at least one surface of a backing material.

The planarization of a surface that includes platinum and other Group VIII metals typically involves more mechanical than chemical action during a polishing process because they are relatively chemically inert and/or have relatively few volatile produces. Such mechanical polishing uses alumina and silica particles. Unfortunately, mechanical polishing tends to cause the formation of defects (e.g., scratches and particles), both of which can be detected optically, rather than the clean removal of the platinum. Also, many commercially available abrasive slurries do not effectively planarize platinum or other Group VIII metal-containing surfaces either because no material is removed (which results in no change in resistance of the wafer) or the resultant surface has defects therein. For example, those abrasive slurries available under the trade designations KLEBOSOL 1508-50 and 30H50 and GRANITE MSW2000 (all available from Rodel, Phoenix, Ariz.), and other alumina-based slurries do not effectively remove platinum, although GRANITE MSW2000 does remove ruthenium and platinum, it leaves the surface with significant scratches and other defects and is not selective to the underlying substrate resulting in not being able to maintain the structure required. Certain of these compositions are believed to contain an oxidizer, although relatively large amounts (e.g., greater than about 10 weight-%) are typically included.

Thus, there is still a need for methods for planarizing an exposed surface of a substrate that includes platinum and/or other Group VIII metals, particularly in the fabrication of semiconductor devices.

SUMMARY OF THE INVENTION

The present invention provides methods that overcome many of the problems associated with the planarization of a surface that includes platinum and/or another of the Group VIII second and third row metals (i.e., Groups 8, 9, and 10, preferably, Rh, Ru, Ir, Pd, and Pt). Such a surface is referred to herein as a platinum-containing surface, or more generally, a Group VIII metal-containing surface. A "Group VIII metal-containing surface" refers to an exposed region having a Group III metal (particularly, platinum) preferably present in an amount of at least about 10 atomic percent, more preferably at least about 20 atomic percent, and most preferably at least about 50 atomic percent, of the composition of the region, which may be provided as a layer, film, coating, etc., to be planarized (e.g., via chemical-mechanical planarization or polishing) in accordance with the present invention. The surface preferably includes one or more Group VIII metals in elemental form or an alloy thereof (with each other and/or one or more other metals of the Periodic Table), as well as oxides, nitrides, and silicides thereof. More preferably, the surface includes (and most preferably, consists essentially of) one or more Group VIII metals in elemental form or an alloy of Group VIII metals only.

The methods of the present invention involve planarizing a surface using a planarization composition that preferably includes a complexing agent therein (either dispersed or dissolved therein). Optionally, and preferably, an oxidizing agent is also included in the planarization composition.

Preferably, the complexing agent is present in the composition in an amount of at least about 0.01% by weight, more preferably no greater than about 10% by weight, and most preferably, in an amount of about 0.05% to about 5% by weight. A preferred group of complexing agents includes organic chelating acids, cyclic dienes, organic amines, or combinations thereof.

Herein, as is conventionally understood, "planarizing" or "planarization" refers to the removal of material from a surface, whether it be a large or small amount of material, either mechanically, chemically, or both. This also includes removing material by polishing. As used herein, "chemical-mechanical polishing" and "CMP" refer to a dual mechanism having both a chemical component and a mechanical component, wherein corrosion chemistry and fracture mechanics both play a roll in the removal of material, as in wafer polishing.

The planarization composition can optionally include abrasive particles, thereby resulting in an abrasive slurry, and be used in planarization techniques with conventional polishing pads that do not have abrasive particles embedded therein. Alternatively, the planarization composition without abrasive particles therein can be used with fixed abrasive articles (also referred to as abrasive polishing pads) in place of conventional polishing pads. Such fixed abrasive articles include a plurality of abrasive particles dispersed within a binder adhered to at least one surface of a backing material. If the oxidizing agent is not stable in a composition with abrasive particles (i.e., an abrasive slurry), they may be provided by separate delivery systems and/or in separate compositions and mixed at the point of use.

In one aspect of the present invention, a planarization method is provided that includes: positioning a Group VIII metal-containing surface of a substrate (preferably, a semiconductor substrate or substrate assembly such as a wafer) to interface with a polishing pad; supplying a planarization composition in proximity to the interface; and planarizing the Group VIII metal-containing surface. The Group VIII metal is selected from the group consisting of rhodium, iridium, ruthenium, osmium, palladium, platinum, and combinations thereof The planarization composition includes a complexing agent. In certain embodiments, the method is carried out in one step (i.e., without an intervening rinse step between the use of two different planarization compositions). In certain embodiments, the complexing agent includes a cyclic diene, an organic amine, or a combination thereof. In certain other embodiments, the planarization composition includes an organic acid and an amine.

In one aspect of the invention, there is provided a planarization method that includes: positioning a Group VIII metal-containing surface of a substrate to interface with a polishing surface, wherein the Group VIII metal is selected from the group consisting of rhodium, iridium, ruthenium, osmium, palladium, platinum, and combinations thereof; supplying a planarization composition in proximity to the interface; and planarizing the Group VIII metal-containing surface; wherein the planarization composition includes an organic amine and an organic chelating acid.

In another aspect of the invention, there is provided a planarization method that includes: positioning a Group VIII metal-containing surface of a substrate to interface with a polishing surface, wherein the Group VIII metal is selected from the group consisting of rhodium, iridium, ruthenium, osmium, palladium, platinum, and combinations thereof; supplying a planarization composition in proximity to the interface; and planarizing the Group VIII metal-containing surface; wherein the planarization composition includes abrasive particles and a complexing agent; and further wherein a majority of the plurality of abrasive particles are $CeO_2$ abrasive particles.

In still another aspect of the invention, there is provided a planarization method that includes: positioning a Group VIII metal-containing surface of a substrate to interface with a polishing surface, wherein the Group VIII metal is selected from the group consisting of rhodium, iridium, ruthenium, osmium, palladium, platinum, and combinations thereof; supplying a planarization composition in proximity to the interface; and planarizing the Group VIII metal-containing surface; wherein the planarization composition includes a complexing agent selected from the group consisting of a cyclic diene, an organic amine, an organic chelating acid, and combinations thereof; and further wherein the method is carried out in one step.

In another aspect, a planarization method includes: providing a semiconductor substrate or substrate assembly including at least one region of a platinum-containing surface; providing a polishing surface; providing a planarization composition at an interface between the at least one region of platinum-containing surface and the polishing surface; and planarizing the at least one region of platinum-containing surface; wherein the planarization composition includes a complexing agent selected from the group consisting of a cyclic diene, an organic amine, and combinations thereof.

In still another aspect, a planarization method includes: providing a semiconductor substrate or substrate assembly including at least one region of a platinum-containing surface; providing a polishing surface; providing a planarization composition at an interface between the at least one region of platinum-containing surface and the polishing surface; and planarizing the at least one region of platinum-containing surface; wherein the planarization composition includes an organic amine and an organic chelating acid.

In another aspect, a planarization method includes: providing a semiconductor substrate assembly including at least one region of a platinum-containing surface; providing a polishing surface; providing a planarization composition at an interface between the at least one region of platinum-containing surface and the polishing surface; and planarizing the at least one region of platinum-containing surface; wherein the planarization composition includes abrasive particles and a complexing agent; and further wherein a majority of the plurality of abrasive particles are $CeO_2$ abrasive particles.

In yet another aspect, a planarization method includes: providing a semiconductor substrate or substrate assembly including at least one region of a platinum-containing surface; providing a polishing surface; providing a planarization composition at an interface between the at least one region of platinum-containing surface and the polishing surface; and planarizing the at least one region of platinum-containing surface; wherein the planarization composition includes a complexing agent selected from the group consisting of a cyclic diene, an organic amine, an organic chelating acid, and combinations thereof; and further wherein the method is carried out in one step.

In still another aspect, a planarization method for use in forming a capacitor or barrier layer includes: providing a semiconductor substrate or substrate assembly having a patterned dielectric layer formed thereon and a Group VIII metal-containing layer formed over the patterned dielectric layer, wherein the Group VIII metal is selected from the group consisting of rhodium, iridium, ruthenium, osmium, palladium, platinum, and combinations thereof; positioning a first portion of a polishing surface for contact with the Group VIII metal-containing layer; providing a planarization composition in proximity to the contact between the polishing surface and the Group VIII metal-containing layer; and planarizing the Group VIII metal-containing layer; wherein the planarization composition includes a complexing agent selected from the group consisting of a cyclic diene, an organic amine, and combinations thereof.

The present invention also provides a planarization method for use in forming a capacitor or barrier layer that includes: providing a semiconductor substrate or substrate assembly having a patterned dielectric layer formed thereon and a Group VIII metal-containing layer formed over the patterned dielectric layer, wherein the Group VIII metal is selected from the group consisting of rhodium, iridium, ruthenium, osmium, palladium, platinum, and combinations thereof; positioning a first portion of a polishing surface for contact with the Group VIII metal-containing layer; providing a planarization composition in proximity to the contact between the polishing surface and the Group VIII metal-containing layer; and planarizing the Group VIII metal-containing layer; wherein the planarization composition includes an organic amine and an organic chelating acid.

The present invention also provides a planarization method for use in forming a capacitor or barrier layer that includes: providing a semiconductor substrate or substrate assembly having a patterned dielectric layer formed thereon and a Group VIII metal-containing layer formed over the patterned dielectric layer, wherein the Group VIII metal is selected from the group consisting of rhodium, iridium, ruthenium, osmium, palladium, platinum, and combinations thereof; positioning a first portion of a polishing surface for contact with the Group VIII metal-containing layer; providing a planarization composition in proximity to the contact between the polishing surface and the Group VIII metal-containing layer; and planarizing the Group VIII metal-containing layer; wherein the planarization composition includes abrasive particles and a complexing agent; and further wherein a majority of the plurality of abrasive particles are $CeO_2$ abrasive particles.

In another aspect, a planarization method for use in forming a capacitor or barrier layer includes: providing a semiconductor substrate or substrate assembly having a patterned dielectric layer formed thereon and a Group VIII metal-containing layer formed over the patterned dielectric layer, wherein the Group VIII metal is selected from the group consisting of rhodium, iridium, ruthenium, osmium, palladium, platinum, and combinations thereof; positioning a first portion of a polishing surface for contact with the Group VIII metal-containing layer; providing a planarization composition in proximity to the contact between the polishing surface and the Group VIII metal-containing layer; and planarizing the Group VIII metal-containing layer; wherein the planarization composition includes a complexing agent selected from the group consisting of a cyclic diene, an organic amine, an organic chelating acid, and combinations thereof; and further wherein the method is carried out in one step.

As used herein, "semiconductor substrate or substrate assembly" refers to a semiconductor substrate such as a base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as capacitor plates or barriers for capacitors.

DESCRIPTION OF THE PREFERRED EMBODIMENTS

Figure 1A:
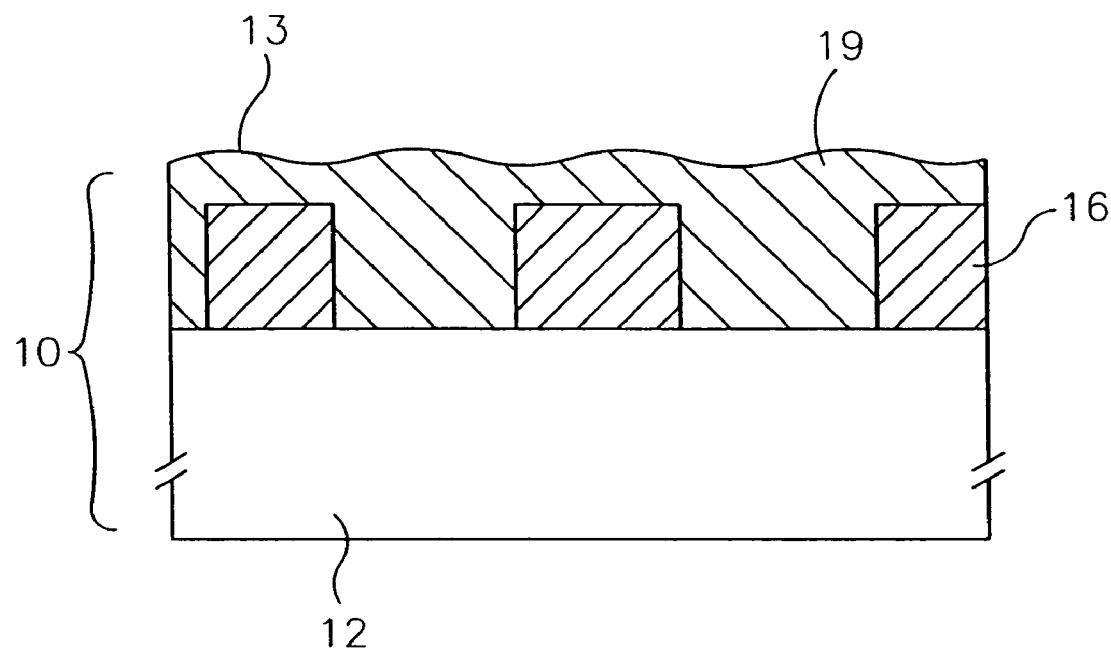
FIGS. 1A and 1B are cross-sectional illustrations of one portion of a wafer before and after a planarization process has been performed in accordance with the present invention.

The present invention provides methods of planarization of a surface that includes platinum and/or one or more of the other Group VIII metals. The Group VIII metals are also referred to as the Group VIIIB elements or transition metals of Groups 8, 9, and 10 of the Periodic Table. The second and third row Group VIIIB metals include Rh, Ru, Ir, Pd, Pt, and Os. Preferably, surfaces that include Rh, Ru, Ir, Pd, and/or Pt can be planarized according to methods of the present invention. Such a surface is referred to herein as a Group VIII metal-containing surface (this refers to those containing second and/or third row transition metals).

Preferably, a "Group VIII metal-containing surface" refers to an exposed region having a Group VIII metal (particularly, platinum) present in an amount of at least about 10 atomic percent, more preferably at least about 20 atomic percent, and most preferably at least about 50 atomic percent, of the composition of the region, which may be provided as a layer, film, coating, etc., to be planarized (e.g., via chemical-mechanical or mechanical planarization or polishing) in accordance with the present invention.

The planarization of such surfaces, particularly a surface that includes platinum, typically involves mechanical methods with relatively hard particles such as alumina ($Al_2O_3$) and/or silica ($SiO_2$) particles, which by themselves can cause severe smearing, slow removal rates, and defects, rather than the clean removal of the material. Use of a planarization composition that includes a complexing agent either in combination with a plurality of abrasive particles in the composition or with a fixed abrasive article reduces, and often eliminates, the problem of defect formation, smearing, and often results in increased selectivity and removal rates.

Significantly, the methods of the present invention are particularly advantageous in platinum-containing or other second and third row Group VIII metal-containing materials (e.g., metals, alloys, oxides) from a surface in preference to materials containing other metals. This is important in selectively removing material from platinum-containing or other second and third row Group VIII metal-containing layers without removing, for example, significant amounts of underlying layers, such as oxide layers and nitride layers (e.g., TEOS or BPSG layers). Preferably, the selectivity for removal of material from a second and third row Group VIII metal-containing surface relative to materials containing other metals (e.g., BPSG or TEOS) is at least about 10:1, and more preferably, within a range of about 20:1 to about 100:1, depending on the chemistry and process conditions.

The planarization composition can be used in slurry planarization (i.e., in a conventional planarization process in which the planarization composition includes the abrasive particles with a polishing pad that does not include abrasive particles) or in fixed abrasive planarization. Thus, as used herein, a "polishing surface" refers to a polishing pad or a fixed abrasive article. Preferably, slurry planarization is used in the methods of the present invention. Preferably, when present in the planarization composition, the composition includes the abrasive particles in an amount of about 1% by weight to about 30% by weight, and more preferably, about 1% by weight to about 15% by weight, based on the total weight of the composition.

Typically, lower amounts of abrasive particles provide better selectivity of the Group VIII metal-containing surface relative to an oxide layer such as BPSG. Generally, however, the optimum level of selectivity for a particular metal is obtained by balancing the type and amount of abrasive particles, the type and amount of complexing agent, and the pH of the composition.

A wide variety of abrasive particles can be used either in an abrasive slurry or in a fixed abrasive article. Typically, such abrasive particles range in particle size (i.e., the largest dimension of the particle) on average from about 10 nanometers (nm) to about 5000 nm, and more often about 30 nm to about 1000 nm. For preferred embodiments, suitable abrasive particles have an average particle size of about 100 nm to about 300 nm.

Examples of suitable abrasive particles include, but are not limited to, alumina ($Al_2O_3$), silica ($SiO_2$), ceria ($CeO_2$), titania ($TiO_2$), zirconia ($ZrO_2$), manganese dioxide ($MnO_2$), and tantalum dioxide ($TaO_2$). Preferred abrasive particles include alumina ($Al_2O_3$), silica ($SiO_2$), ceria ($CeO_2$), titania ($TiO_2$), and zirconia ($ZrO_2$). Various combinations of abrasive particles can be used if desired.

Preferably, for certain embodiments, abrasive particles include those that have a hardness of no greater than about 9 Mohs, and more preferably no less than about 6 Mohs. These include, for example, ceria ($CeO_2$), which has a hardness of about 6 Mohs, alumina ($Al_2O_3$), which has a hardness of about 9 Mohs, and silica ($Si_2O_3$), which has a hardness of about 7.

In certain methods in accordance with the present invention, preferably, a majority of the plurality of abrasive particles (either in an abrasive slurry or in a fixed abrasive article) are $CeO_2$ particles. This typically results in reduced formation of defects. In certain other methods in accordance with the present invention, preferably, a majority of the plurality of abrasive particles (either in an abrasive slurry or in a fixed abrasive article) have a hardness of about 8 Mohs to about 9 Mohs. This typically results in increased removal rates.

For other embodiments of the present invention, harder particles like alumina particles with certain complexing agents such as organic acid oxidizers work more effectively than ceria or silica with respect to selective removal of the Group VIII-metal-containing surface.

The planarization composition includes a complexing agent. The complexing agent is typically a solid or liquid at room temperature. It can be dispersed or dissolved in the liquid medium of the planarization composition, which typically includes water, although other solvents or nonsolvating liquid media can also be used in place of water or in addition to water, such as glycols.

The complexing agents are compounds that form good ligands with the Group VIII metals. Compounds that form chelating ligands are particularly desirable, although this is not a requirement. For example, although ammonium hydroxide is a good ligand for platinum, it did not remove any significant amount of metal. Although not intending to be limiting, it is believed that the complexing agent forms a soluble complex with the metal and/or oxidizes the metal to form a passivation layer thereby assisting in its removal.

Examples of suitable complexing agents include organic chelating acids or their salts, cyclic dienes, and amines. Examples of suitable organic chelating acids include, but are not limited to, acetic acid, ascorbic acid, citric acid, propenoic acid, tartaric acid, succinic acid. Examples of suitable cyclic dienes, which may be substituted or unsubstituted, include 1,5-cyclooctadiene (COD) and 1,5-dimethyl-1,5-cyclooctadiene. Examples of suitable organic amines include ethylamine ($EtNH_2$), methylamine ($MeNH_2$), triethylamine ($Et_3N$), and trimethylamine ($Me_3N$). Various combinations of complexing agents can be used if desired. A preferred group of complexing agents include acetic acid and salts thereof (e.g., sodium acetate).

Preferably, the complexing agent is present in the composition in an amount of at least about 0.01% by weight, more preferably no greater than about 10% by weight, and most preferably, in an amount of about 0.05% to about 5% by weight, based on the total weight of the composition.

For various desired effects, a planarization composition can optionally and preferably include an oxidizing agent to aid in the planarization. Examples of suitable planarization compositions are disclosed in Applicant's Assignee's copending U.S. patent applications Ser. No 10/028,249, filed on Dec. 21, 2001 entitled METHODS FOR PLANARIZATION OF GROUP VIII METAL-CONTAINING SURFACES USING OXIDIZING AGENTS; and Ser. No. 10/032,357, filed on Dec. 21, 2001 entitled METHODS FOR PLANARIZATION OF GROUP VIII METAL-CONTAINING SURFACES USING OXIDIZING GASES.

Preferably, the oxidizing agent is one that has a standard oxidation potential of at least about 1.4 versus standard hydrogen electrode at 25° C. Examples include peroxides (e.g., hydrogen peroxide), nitrates (e.g., ceric ammonium nitrate (($NH_4)_2Ce(NO_3)_6$) and ceric nitrate ($Ce(NO_3)_4$)), permanganates (e.g., $KMnO_4$), bromates (e.g., $KBrO_4$), perchlorates (e.g., $KClO_4$), hypochlorites (e.g., HClO and KClO), or combinations thereof. A preferred group of oxidizing agents include hydrogen peroxide, ceric ammonium nitrate, ceric nitrate, and potassium permanganate. Preferably, the oxidizing agent is present in the composition in an amount of no greater than about 10% by weight, and more preferably, in an amount of about 0.1% to about 1% by weight.

Other additives can be included as well for desired effects. These include, but are not limited to, a surfactant (e.g., polyethylene glycol, polyoxy ethylene ether, or polypropylene glycol) to enhance wettability and reduce friction, a thickener (e.g., CARBOPOL) to achieve a desired viscosity, a buffering agent (e.g., $H_2SO_4$, $NH_4OH$, acetate, and acetic acid) to achieve a desired pH, etc. Preferably, the composition is an aqueous solution of these components. More preferably, the aqueous planarization composition has an acidic pH.

The various components of the planarization composition are combined in a liquid medium and mixed. The various components may be dissolved or dispersed in the liquid medium, which typically includes water but may include organic solvents if desired. Alternatively, if there are compatibility problems or storage problems, the various components of the planarization composition can be combined at the site of planarization. This includes any abrasive particles that might be used to form a slurry.

For certain embodiments, the planarization composition includes a plurality of abrasive particles. For other embodiments, the planarization composition is essentially free of abrasive particles when supplied to the interface of the fixed abrasive article and the workpiece surface. However, in these latter embodiments, it is contemplated that planarization is accomplished by one or both of the fixed abrasive article and/or abrasive particles that may be removed from the fixed abrasive article at the fixed abrasive/surface interface in combination with the planarization composition. In any event, abrasive particles are typically not present in the composition as initially applied, i.e., they are not supplied from a source external to the polishing interface.

Preferably, a method in accordance with the present invention is conducted at atmospheric pressure and at a temperature of about 40° F. (about 4° C.) to about 145° F. (about 63° C.), and more preferably at a temperature of about 75° F. (24° C.) to about 115° F. (46° C.). In many instances, however, it would be desirable to maintain a temperature at or below ambient temperature during planarization of Group VIII metal with a fixed abrasive article. This is seldom practical in slurry planarization (i.e., in a conventional planarization process in which the planarization composition includes the abrasive particles) where a lower slurry temperature likely results in poor dispersion of abrasive particles in the slurry composition during planarization. Accordingly, elevated temperatures are typically utilized during slurry planarization.

Various planarization assemblies or units for performing methods of the invention are readily available and are clearly contemplated by the scope of the present invention as described in the accompanying claims. Such planarization assemblies can create an interface between a polishing pad or a fixed abrasive article and the substrate surface (e.g., wafer surface) in various manners, e.g., rotation, movement, pressure, etc., to achieve planarization. A planarization composition is typically introduced at or near the interface, by a variety of methods such as by dripping, spraying, or other dispensing means, or by presoaking a polishing pad, although other locations and methods of introduction can be used.

In a typical planarizing machine, a polishing pad or fixed abrasive article is fixed on a platen or table, a carrier assembly that includes a substrate holder to support the substrate (e.g., wafer) typically using suction, and a drive assembly to rotate and/or reciprocate the platen and/or a drive assembly to rotate and/or translate the substrate holder during planarization. Thus, conventional planarizing machines rotate the carrier assembly, the polishing pad or fixed abrasive article, or both the carrier assembly and the polishing pad or fixed abrasive article. In general, the planarizing machines are used to produce a planarization reaction product at the surface of a substrate whose hardness is less than the hardness of the abrasive particles and whose adhesion to the substrate is less than the original surface material; and to remove the reaction produce using the abrasive particles.

Typically, the polishing pads, with or without abrasive particles embedded therein, are disk-shaped and rotatable about a fixed plane and axis at constant or variable speeds. Typically, the speed of rotation ranges from about 2 revolutions per minute (rpm) to about 200 rpm.

Typically, a polishing pad is presoaked and continually rewet with the planarization composition. If the polishing pad does not include abrasive particles embedded therein, the planarization composition includes abrasive particles, which is then referred to as an abrasive slurry. The planarization composition may be applied to the interface between a polishing pad and a substrate surface using a variety of techniques. For example, the component parts of the composition may be applied separately and mixed at the interface or immediately before contacting the interface. The planarization composition can be applied by pumping it through the pad. Alternatively, it can be applied at the leading edge of the pad, although this may not provide uniform distribution of the planarization composition across the surface being planarized, which is desirable.

The polishing pad can be any of a wide variety of conventional polishing pads that are used with abrasive slurries. They can be made from a material such as polyurethane, polyester, acrylic, acrylic ester copolymers, polytetrafluoroethylene, polypropylene, polyethylene, cellulose, cellulose esters, polamides, polyimides, polysiloxane, polycarbonates, epoxides, phenolic resins, etc. They include, for example, a polyurethane-based foam material, wherein the foam cell walls of the pad aid in removal of reaction products at the wafer surface and the pores within the pad assist in supplying slurry to the pad/wafer interface. They can include convex or concave features, which can be formed by embossing a surface pattern. For example, a polishing pad can have continuous grooves in concentric ellipses in the surface of the pad for more uniform slurry delivery and more effective debris removal. Commercially available polishing pads can be obtained under the trade designations "URII," "Sycamore," and "Polytex" from Rodel, Phoenix, Ariz. Examples of polishing pads are also disclosed in U.S. Pat. No. 6,039,633 (Chopra).

In general, a fixed abrasive article includes a plurality of abrasive particles dispersed within a binder that forms a three-dimensional fixed abrasive element that is adhered to one surface of a backing material. They are described, for example, in U.S. Pat. No. 5,692,950 (Rutherford, et al.) and International Patent Publication WO 98/06541. Commercially available fixed abrasive articles can be obtained from Tokyo Sumitsu Kageki and Ebera Corporation, both of Japan, and Minnesota Mining and Manufacturing Company (3M Company) of St. Paul, Minn. An example of a preferred fixed abrasive article is a ceria-based pad commercially available from 3M Company under the trade designation "SWR 159." Such fixed abrasive articles can be used with a planarization composition as described herein with or without abrasive particles in the planarization composition.

It is highly desirable to have a high polishing rate (i.e., the rate at which material is removed from the substrate) to reduce the duration of each planarizing cycle, the polishing rate is preferably uniform across the substrate to produce a uniformly planar surface. Preferably, the polishing rate is controlled to provide accurate, reproducible results. Also, preferably, the planarization process is carried out in one cycle (i.e., one step). That is, for the removal of any material from a particular surface, there is only one planarization cycle without any intervening rinse cycles. This planarization process is then typically followed by a post-planarization clean process in which abrasive particles are not used.

Figure 1B:
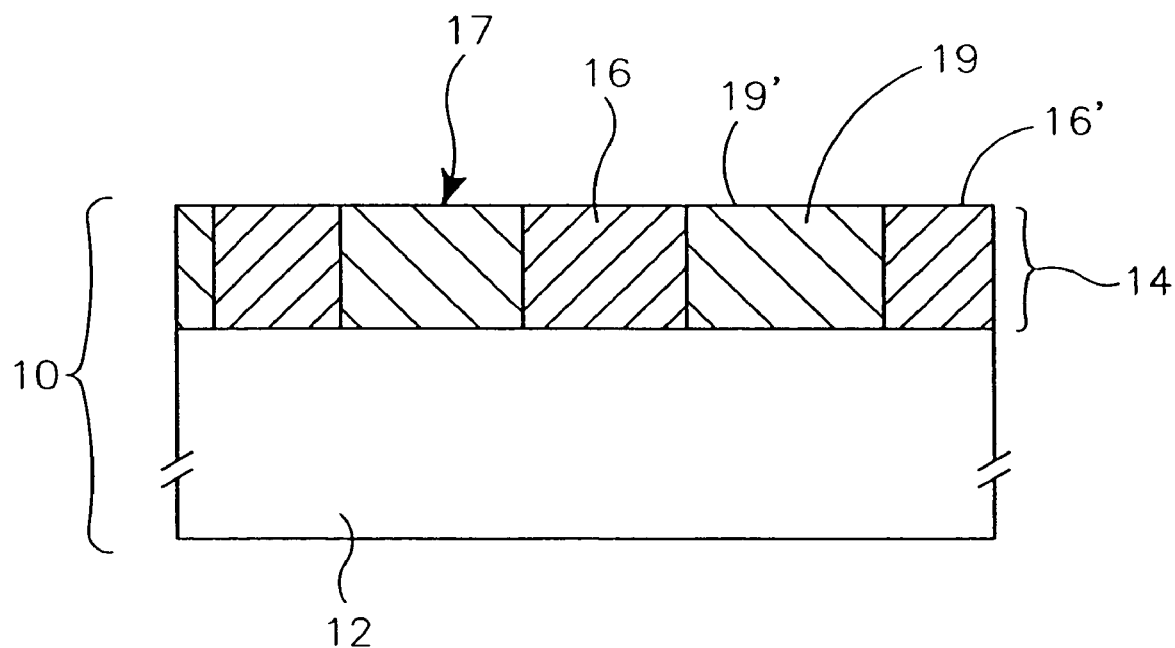

The figures provide further information about the methods of the invention. FIG. 1A illustrates one portion of a wafer 10 prior to planarization in accordance with the present invention having features that are filled with the material to be removed through planarization. The wafer portion 10 includes a substrate assembly 12 having junctions 16 formed thereon. A capacitor and/or barrier layer material 19 is then formed over the substrate assembly 12 and the junctions 16. The capacitor and/or barrier layer material 19 may be any conductive material such as platinum or any other suitable conductive second or third row Group V-III metal-containing capacitor and/or barrier material. Generally, as shown in FIG. 1A, the nonplanar upper surface 13 of capacitor and/or barrier layer 19 is subjected to planarization or other processing in accordance with the present invention. The resulting wafer 10, which is shown in FIG. 1B, includes an upper surface 17 planarized such that the thickness of the wafer 10 is substantially uniform across the entire wafer 10 so that the wafer now includes a capacitor and/or barrier structure layer 14.

Figure 2A:
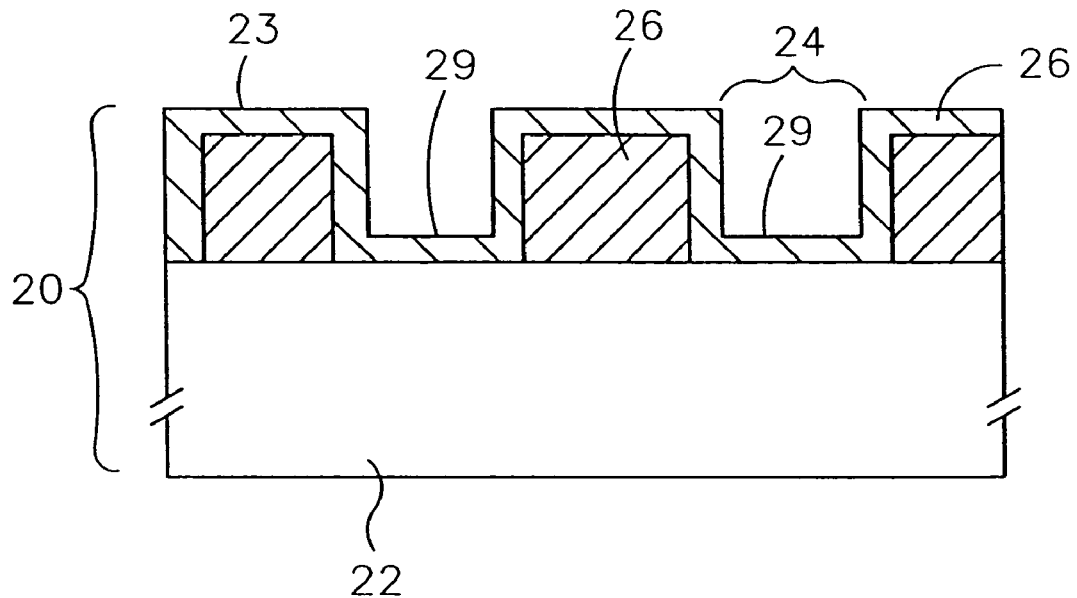
FIGS. 2A and 2B are cross-sectional illustrations of one portion of a wafer before and after a planarization process has been performed in accordance with the present invention.
Figure 2B:
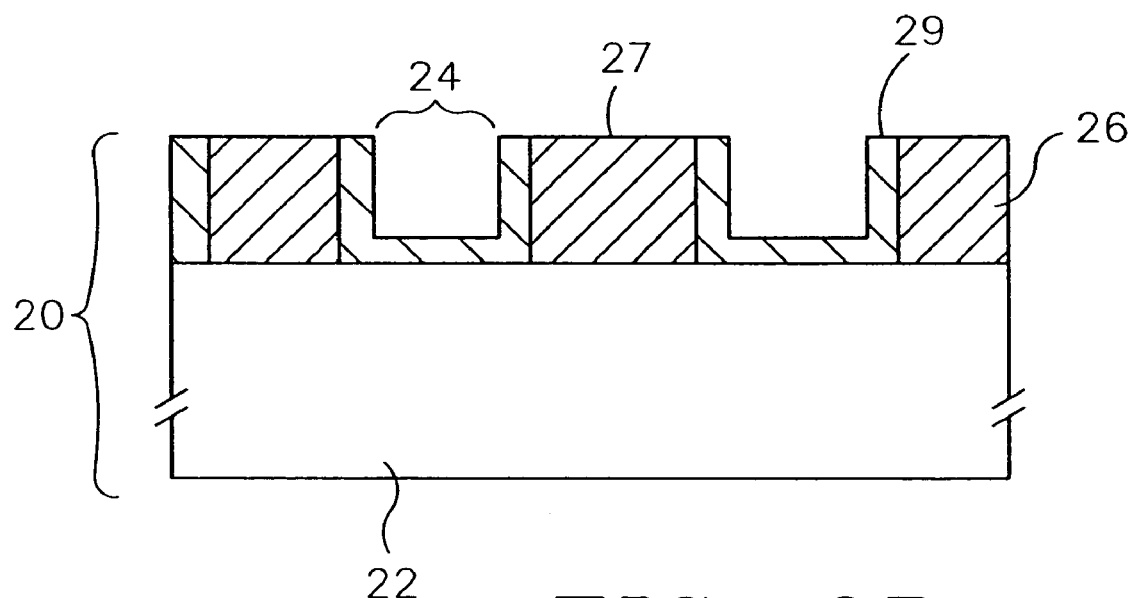

FIG. 2A illustrates one portion of a wafer 20 prior to planarization in accordance with the present invention having features that have a conformal layer of the material to be removed through planarization. The wafer portion 20 includes a substrate assembly 22 having a patterned dielectric layer 26 formed thereon. Such a patterned dielectric layer 26 can be used in a variety of structures, particularly a capacitor structure. The patterned dielectric layer 26 can be formed of any material that provides electrical isolation between metal regions (e.g., silicon dioxide, silicon nitride, or BPSG). An electrode layer 29 is then formed over the substrate assembly 22 and the patterned dielectric layer 26. The electrode layer 29 may be platinum or any other suitable conductive second or third row Group VIIIB or Group IB metal-containing material. Generally, as shown in FIG. 2A, the nonplanar upper surface 23 of electrode layer 29 is subjected to planarization or other processing in accordance with the present invention. The resulting wafer 20, as shown in FIG. 2B, includes an upper surface 27 planarized such that the thickness of the wafer 20 is substantially uniform across the entire wafer 20 that the wafer now includes electrically conducting regions 24 isolated within the patterned dielectric material 26 forming a capacitor structure. If desired, prior to planarization, the conformal layer 29 and openings 24 can be covered with a photoresist or other material that is removed after the planarization so the abrasive does not fall into the openings 24.

These figures are shown only to illustrate a surface having nonuniformities, such as height differences, in the fabrication of semiconductor devices. The present invention is not limited to use with nonplanar surfaces, such as that shown in figures. The present invention is also beneficial for use with substantially planar surfaces. For example, the methods in accordance with the present invention is beneficial during the whole planarization process, even at the end of the process when the surface being planarized is in a substantially planar state.

The following examples are offered to further illustrate the various specific and preferred embodiments and techniques. It should be understood, however, that many variations and modifications may be made while remaining within the scope of the present invention.

EXAMPLES

Example 1

A test sample was cut from a wafer containing a blanket layer of 2700 Å of platinum. Several locations on the sample were measured for sheet resistance before any polishing (four points measured), directly correlating the metal thickness to the sheet resistance. A slurry was prepared by addition of 0.5 milliliter (0.5 ml) of glacial acetic acid and 80 ml DIW to 20 ml of Rodel's CMP slurry containing $Al_2O_3$ as the abrasive (GRANITE MSW2000 Part A). The sample was fixed to the carrier on a Beuhler Minimet 1000 polisher and was polished on a Rodel polishing pad upon which several milliliters of the prepared slurry was added. Polishing was carried out using a pressure of 15 pounds and a speed of 50 revolutions per minute (rpm). After 2 minutes the sample was rinsed and dried, and the sheet resistance measured again. The higher sheet resistance values (four points measured) yielded a calculated estimate of 125 Å of film removed (or a removal rate of approximately 62.5 Å per minute). By comparison, the same slurry without the added glacial acetic acid yielded little change in the sheet resistance of a similar sample, and caused only scratches and some areas of film delaminated from the substrate. Also, the slurry without acetic acid had poor selectivity relative to the underlying oxide film—on the order of 1:1 vs. 6:1 with acetic acid.

Example 2

A test sample was cut from a wafer containing a blanket layer of 2700 Å of platinum. Several locations on the sample were measured for sheet resistance before any polishing (four points measured), directly correlating the metal thickness to the sheet resistance. A slurry was prepared by addition of 0.3 milliliter (0.3 ml) of hydrogen peroxide and 0.5 ml glacial acetic acid to 80 ml of water and 20 ml of Rodel's CMP slurry containing $Al_2O_3$ as the abrasive (GRANITE MSW2000 Part A). The sample was fixed to the carrier on a Beuhler Minimet 1000 polisher and was polished on a Rodel polishing pad upon which several milliliters of the prepared slurry was added. Polishing was carried out using a pressure of 15 pounds and a speed of 50 revolutions per minute (rpm). After 2 minutes the sample was rinsed and dried, and the sheet resistance measured again. The higher sheet resistance values (four points measured) yielded a calculated estimate of 293 Å of film removed (or a removal rate of approximately 146.5 Å per minute). By comparison, the same slurry without the added hydrogen peroxide and glacial acetic acid yielded little change in the sheet resistance of a similar sample, and caused only scratches and some areas of film delaminated from the substrate. Also selectvity to oxide was poor. With only hydrogen peroxide removal rate was lower and selectivity was poorer.

Example 3

A test sample was cut from a wafer containing a blanket layer of 2700 Å of platinum. Several locations on the sample were measured for sheet resistance before any polishing (four points measured), directly correlating the metal thickness to the sheet resistance. A slurry was prepared by addition of 0.5 milliliter (0.5 ml) of triethylamine to 80 ml of water and 20 ml of Rodel's CMP slurry containing $Al_2O_3$ as the abrasive (GRANITE MSW2000 Part A). The sample was fixed to the carrier on a Beuhler Minimet 1000 polisher and was polished on a Rodel polishing pad upon which several milliliters of the prepared slurry was added. Polishing was carried out using a pressure of 15 pounds and a speed of 50 revolutions per minute (rpm). After 2 minutes the sample was rinsed and dried, and the sheet resistance measured again. The higher sheet resistance values (four points measured) yielded a calculated estimate of 185 Å of film removed (or a removal rate of approximately 92.5 Å per minute). By comparison, the same slurry without the added triethylamine yielded little change in the sheet resistance of a similar sample, and caused only scratches and some areas of film delaminated from the substrate.

Example 4

A test sample was cut from a wafer containing a blanket layer of 2700 Å of platinum. Several locations on the sample were measured for sheet resistance before any polishing (four points measured), directly correlating the metal thickness to the sheet resistance. A slurry was prepared by addition of 0.5 milliliter (0.5 ml) of 1 Normal Ascorbic acid to 80 ml of water and 20 ml of Rodel's CMP slurry containing $Al_2O_3$ as the abrasive (GRANITE MSW2000 Part A). The sample was fixed to the carrier on a Beubler Minimet 1000 polisher and was polished on a Rodel polishing pad upon which several milliliters of the prepared slurry was added. Polishing was carried out using a pressure of 15 pounds and a speed of 50 revolutions per minute (rpm). After 2 minutes the sample was rinsed and dried, and the sheet resistance measured again. The higher sheet resistance values (four points measured) yielded a calculated estimate of 244 Å of film removed (or a removal rate of approximately 122 Å per minute). By comparison, the same slurry without the added ascorbic acid yielded little change in the sheet resistance of a similar sample, and caused only scratches and some areas of film delaminated from the substrate.

Example 5

A test sample was cut from a wafer containing a blanket layer of 2700 Å of platinum. Several locations on the sample were measured for sheet resistance before any polishing (four points measured), directly correlating the metal thickness to the sheet resistance. A slurry was prepared by addition of 0.5 milliliter (0.5 ml) of triethylamine and 0.5 ml of 1N ascorbic acid to 80 ml of water and 20 ml of Rodel's CMP slurry containing $Al_2O_3$ as the abrasive (GRANITE MSW2000 Part A). The sample was fixed to the carrier on a Beuhler Minimet 1000 polisher and was polished on a Rodel polishing pad upon which several milliliters of the prepared slurry was added. Polishing was carried out using a pressure of 15 pounds and a speed of 50 revolutions per minute (rpm). After 2 minutes the sample was rinsed and dried, and the sheet resistance measured again. The higher sheet resistance values (four points measured) yielded a calculated estimate of 462 Å of film removed (or a removal rate of approximately 231 Å per minute). By comparison, the same slurry without the added triethylamine and ascorbic acid yielded little change in the sheet resistance of a similar sample, and caused only scratches and some areas of film delaminated from the substrate.

Example 6

A test sample was cut from a wafer containing a blanket layer of 2700 Å of platinum. Several locations on the sample were measured for sheet resistance before any polishing (four points measured), directly correlating the metal thickness to the sheet resistance. A slurry was prepared by addition of 1.0 milliliter (1.0 ml) of 1,5-dimethyl-1,5-cyclooctadiene to 80 ml of water and 20 ml of Rodel's CMP slurry containing $Al_2O_3$ as the abrasive (GRANITE MSW2000 Part A). The sample was fixed to the carrier on a Beuhler Minimet 1000 polisher and was polished on a Rodel polishing pad upon which several milliliters of the prepared slurry was added. Polishing was carried out using a pressure of 15 pounds and a speed of 50 revolutions per minute (rpm). After 2 minutes the sample was rinsed and dried, and the sheet resistance measured again. The higher sheet resistance values (four points measured) yielded a calculated estimate of 249 Å of film removed (or a removal rate of approximately 124.5 Å per minute). By comparison, the same slurry without the added 1,5-dimethyl-1,5-cyclooctadiene yielded little change in the sheet resistance of a similar sample, and caused only scratches and some areas of film delaminated from the substrate.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. For example, while the description above focused on planarization of semiconductor-based substrates, the compositions and methods of the invention are also applicable to, for example, polishing glasses and contact lenses, as one of many other possible applications. The complete disclosures of all patents, patent documents, and publications listed herein are incorporated by reference, as if each were individually incorporated by reference.

What is claimed is:

1. A method comprising:
    positioning a Group VIII metal-containing surface of a substrate to interface with a polishing surface, wherein the Group VIII metal is selected from the group of rhodium, indium, ruthenium, osmium, palladium, platinum, and combinations thereof;
    supplying a composition in proximity to the interface; and
    polishing the Group VIII metal-containing surface using the composition;
    wherein the composition comprises a complexing agent selected from the group of a cyclic diene, an organic amine, and combinations thereof.

2. The method of claim 1 wherein polishing the Group VIII metal-containing surface results in a substantially surface defect-free state.

3. The method of claim 1 wherein the Group VIII metal-containing surface of the substrate comprises a Group VIII metal in elemental form or an alloy thereof.

4. The method of claim 3 wherein the Group VIII metal-containing surface comprises elemental platinum or a platinum alloy.

5. The method of claim 4 wherein the Group VIII metal-containing surface comprises elemental platinum.

6. The method of claim 1 wherein the composition further comprises an oxidizing agent.

7. The method of claim 6 wherein the oxidizing agent is selected from the group consisting of a peroxide, a nitrate, a permanganate, and a combination thereof.

8. The method of claim 1 wherein the Group VIII metal-containing surface is removed relative to an oxide layer at a selectivity ratio of at least about 10:1.

9. A method comprising:
positioning a Group VIII metal-containing surface of a substrate to interface with a material removal surface, wherein the Group VIII metal is selected from the group of rhodium, iridium, ruthenium, osmium, palladium, platinum, and combinations thereof;
supplying a composition in proximity to the interface; and
removing material from the Group VIII metal-containing surface using the composition;
wherein the composition comprises a complexing agent selected from the group of a cyclic diene, an organic amine, and combinations thereof.

10. The method of claim 9 wherein removing material from the Group VIII metal-containing surface results in a substantially surface defect-free state.

11. A method comprising:
positioning a Group VIII metal-containing surface of a substrate to interface with a polishing surface, wherein the Group VIII metal is selected from the group consisting of rhodium, iridium, ruthenium, osmium, palladium, platinum, and combinations thereof;
supplying a composition in proximity to the interface; and
polishing the Group VIII metal-containing surface using the composition;
wherein the composition comprises an organic amine and an organic chelating acid or salt thereof.

12. The method of claim 11 wherein polishing the Group VIII metal-containing surface results in a substantially surface defect-free state.

13. The method of claim 11 wherein the Group VIII metal-containing surface comprises elemental platinum.

14. The method of claim 11 wherein the composition further comprises an oxidizing agent.

15. The method of claim 14 wherein the oxidizing agent is selected from the group consisting of a peroxide, a nitrate, a permanganate, and a combination thereof.

16. The method of claim 11 wherein the organic chelating acid is selected from the group consisting of acetic acid, ascorbic acid, citric acid, propenoic acid, tartaric acid, succinic acid, and combinations thereof.

17. A method comprising:
positioning a Group VIII metal-containing surface of a substrate to interface with a material removal surface, wherein the Group VIII metal is selected from the group consisting of rhodium, iridium, ruthenium, osmium, palladium, platinum, and combinations thereof;
supplying a composition in proximity to the interface; and
removing material from the Group VIII metal-containing surface using the composition;
wherein the composition comprises an organic amine and an organic chelating acid or salt thereof.

18. The method of claim 17 wherein removing material from the Group VIII metal-containing surface results in a substantially surface defect-free state.

* * * * *

UNITED STATES PATENT AND TRADEMARK OFFICE
CERTIFICATE OF CORRECTION

PATENT NO.        : 7,244,678 B2                                    Page 1 of 1
APPLICATION NO. : 11/081413
DATED             : July 17, 2007
INVENTOR(S)       : Sinha et al.

It is certified that error appears in the above-identified patent and that said Letters Patent is hereby corrected as shown below:

In column 14, line 44, in Claim 1, delete "indium," and insert -- iridium, --, therefor.

Signed and Sealed this

Twentieth Day of November, 2007

JON W. DUDAS
*Director of the United States Patent and Trademark Office*